(12) United States Patent
Yin et al.

(10) Patent No.: US 11,696,427 B2
(45) Date of Patent: Jul. 4, 2023

(54) CONFIGURABLE PRINTED-CIRCUIT-BOARD-ASSEMBLY COMPONENT PRESSING FIXTURE

(71) Applicant: International Business Machines Corporation, Armonk, NY (US)

(72) Inventors: XiYuan Yin, Guangzhou (CN); Tao Song, Shenzhen (CN); Qiuyi Yu, Shenzhen (CN); Rui Ma, Shenzhen (CN); WeiFeng Zhang, Shenzhen (CN)

(73) Assignee: International Business Machines Corporation, Armonk, NY (US)

(*) Notice: Subject to any disclaimer, the term of this patent is extended or adjusted under 35 U.S.C. 154(b) by 340 days.

(21) Appl. No.: 16/684,641

(22) Filed: Nov. 15, 2019

(65) Prior Publication Data

US 2021/0153395 A1 May 20, 2021

(51) Int. Cl.
*H05K 13/04* (2006.01)
*H05K 13/00* (2006.01)
*H05K 1/14* (2006.01)

(52) U.S. Cl.
CPC ......... *H05K 13/0069* (2013.01); *H05K 1/142* (2013.01); *H05K 13/0421* (2013.01); *H05K 13/0465* (2013.01); *H05K 2201/10265* (2013.01); *H05K 2201/10409* (2013.01)

(58) Field of Classification Search
CPC ........... H05K 13/0421; H05K 13/0465; H05K 13/0069; H05K 1/142; H05K 3/3447; H05K 3/3468; H05K 2201/10265; H05K 2201/10409; H05K 2203/0278; H05K 2203/044
See application file for complete search history.

(56) References Cited

U.S. PATENT DOCUMENTS

| 3,454,971 | A | 7/1969 | Wolf |
| 4,351,516 | A * | 9/1982 | Ersoy ..................... B25B 5/062 269/27 |
| 4,618,131 | A | 10/1986 | Campisi et al. |
| 5,984,293 | A | 11/1999 | Abrahamson et al. |
| 6,264,187 | B1 | 7/2001 | Hertz et al. |

(Continued)

FOREIGN PATENT DOCUMENTS

| CN | 202103964 U | 1/2012 |
| CN | 202685315 U | 1/2013 |

(Continued)

*Primary Examiner* — Paul D Kim
(74) *Attorney, Agent, or Firm* — Peter J. Edwards

(57) ABSTRACT

A pressing device includes a screw body. The screw body includes a screw head that comprises a driver interface. The screw body also includes a screw shaft that comprises a screw tip opposite the screw head with respect to the screw shaft, exterior spiral threads between the screw head and screw tip, and an interior cavity with an opening at the screw tip. The pressing device also includes a pin partially inserted into the interior cavity. The pin comprises a first pin end inserted into the interior cavity, a pin shaft that is connected to the first pin end, and a second pin end that is connected to the pin shaft and that is exterior to the interior cavity. Applying a force to the second pin end in a direction towards the screw head causes the pin shaft to advance into to interior cavity.

18 Claims, 6 Drawing Sheets

(56) References Cited

U.S. PATENT DOCUMENTS

| | | | | |
|---|---|---|---|---|
| 6,711,797 B1* | 3/2004 | Bennett | ................... | B41F 15/18 |
| | | | | 269/20 |
| 6,886,820 B1* | 5/2005 | Hausler, III | ............ | B25B 5/062 |
| | | | | 269/24 |
| 7,011,187 B2* | 3/2006 | Steinbeck | ............. | F16F 1/3842 |
| | | | | 188/1.11 R |
| 7,073,252 B1 | 7/2006 | Hertz et al. | | |

FOREIGN PATENT DOCUMENTS

| | | |
|---|---|---|
| CN | 205074642 U | 3/2016 |
| CN | 103934537 B | 5/2016 |

\* cited by examiner

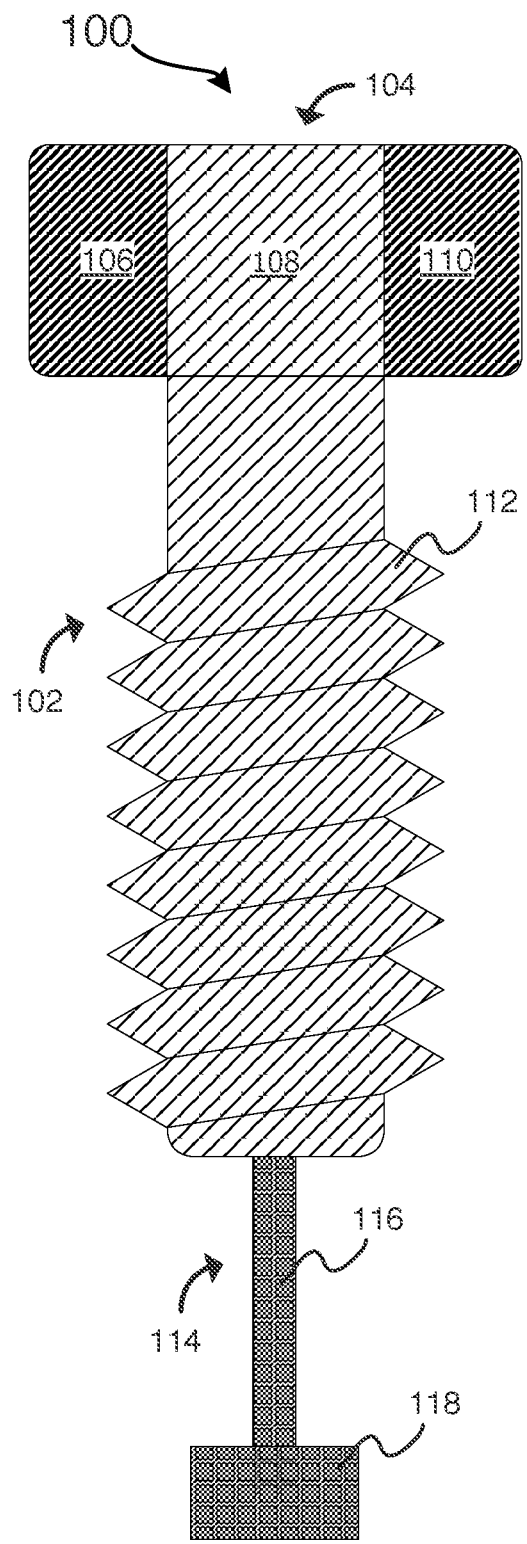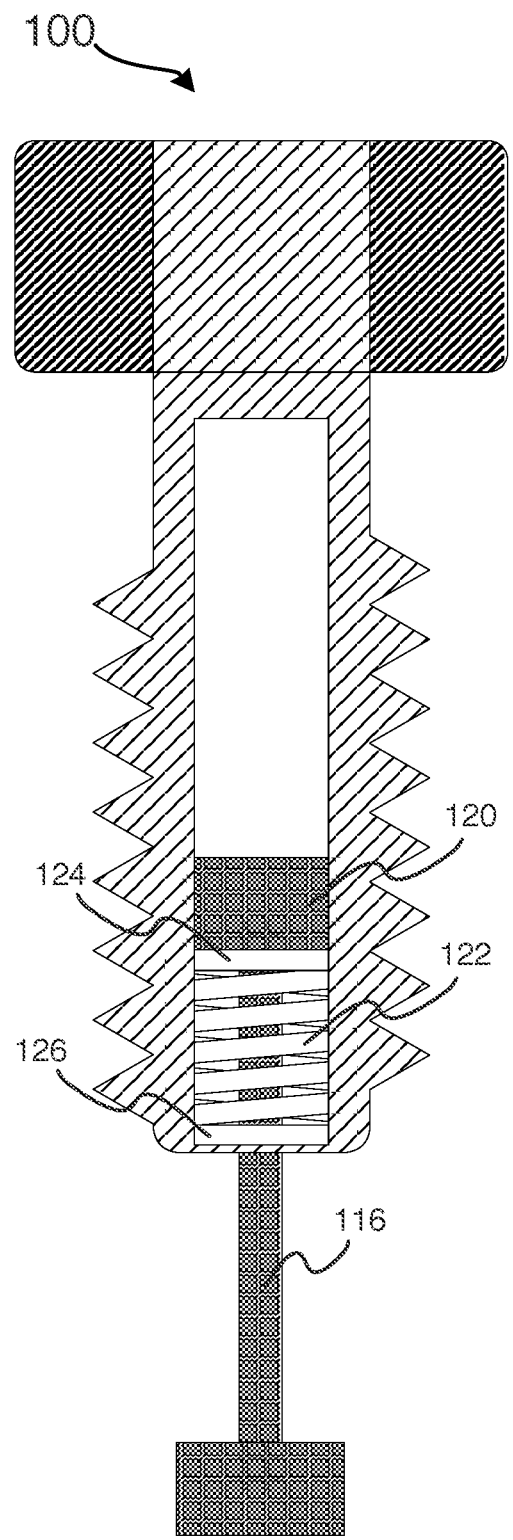
FIG. 1A
FIG. 1B

CONFIGURABLE PRINTED-CIRCUIT-BOARD-ASSEMBLY COMPONENT PRESSING FIXTURE

BACKGROUND

The present disclosure relates to attaching components to printed circuit board assemblies, and more specifically, to fixtures for aligning components during attachment to printed circuit board assemblies.

Printed-circuit-board assemblies (sometimes referred to herein as "PCBAs") sometimes take the form of a printed circuit board with components attached by means of pin through-hole technology. Pin through-hole technology sometimes used to form electrical and structural connections between the components and the printed circuit board. In pin through-hole technology, a component may comprise one or more pin that is inserted into a corresponding number of through holes that have been drilled into the printed circuit board. The component pins may be soldered to the printed-circuit-board through holes to create a reliable structural and electrical connection. Wave soldering is a common method by which component pins may be soldered to through holes.

SUMMARY

Some embodiments of the present disclosure can also be illustrated as a pressing device comprising a screw body. The screw body may comprise a screw head that comprises a driver interface. The screw body may also comprise a screw shaft. The screw shaft may comprise a screw tip opposite the screw head with respect to the screw shaft, exterior spiral threads between the screw head and screw tip, and an interior cavity with an opening at the screw tip. The pressing device may also comprise a pin partially inserted into the interior cavity of the screw body. The pin may comprise a first pin end inserted into the interior cavity, a pin shaft that is connected to the first pin end, and a second pin end that is connected to the pin shaft and that is exterior to the interior cavity. Applying a force to the second pin end in a direction towards the screw head may cause the pin shaft to advance into the cavity.

Some embodiments of the present disclosure can also be illustrated as a pressing fixture. The pressing fixture may comprise a fixture plate that comprises a set of threaded holes. The pressing fixture may also comprise a set of threaded pressing devices inserted partially into the threaded holes. Each threaded pressing device may comprise a screw body. The screw body may comprise a screw shaft. The screw shaft may comprise exterior spiral threads and an interior cavity. The screw body may also comprise a screw head that comprises a driver interface. The pressing device may also comprise a pin partially inserted into the interior cavity. The pin may comprise a first pin end inserted into the interior cavity, a pin shaft that is connected to the first end, and a second pin end that is connected to the pin shaft and that is exterior to the interior cavity. Applying a force to the second pin end in a direction towards the screw head may cause the pin shaft to advance into the interior cavity. Rotating a pressing device in a first direction of rotation that is parallel to the fixture plate may cause the pressing device to move in a first axial direction. The first axial direction may be perpendicular to the fixture plate. Rotating the pressing device in a second direction of rotation that is opposite the first direction of rotation may cause the pressing device to move in a second axial direction that is opposite the first axial direction.

Some embodiments of the present disclosure can also be illustrated as a method of pressing a component for a first printed circuit board assembly to a printed circuit board. The method may comprise inserting the printed circuit board into a pressing fixture. The method may further comprise determining that a historical pressing plan is not available for the printed circuit board. The method may also include mapping a set of components on the first printed circuit board assembly. The method may also include extending a set of pressing devices to the set of components, wherein the weight of a set of pins in the set of pressing devices applies a force to the set of components on the printed circuit board. The method may also include creating, based on the extending, a pressing plan for the first printed circuit board assembly. Finally, the method may include performing wave soldering on the first printed circuit board assembly.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1A depicts a first view of a component pressing device, in accordance with the embodiments of the present disclosure.

FIG. 1B depicts a second view of a component pressing device with the interior components exposed, in accordance with the embodiments of the present disclosure.

Figure 2A:
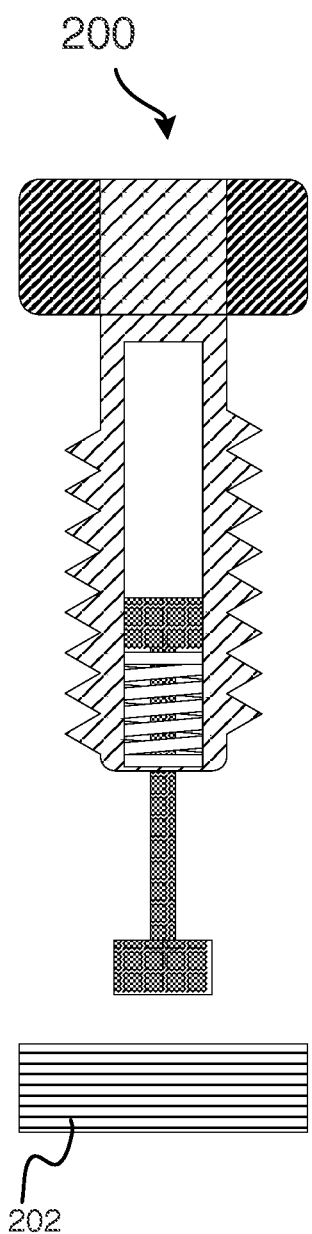
FIG. 2A depicts a first view of a component pressing device before being lowered onto a PCBA component in accordance with the embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to attaching components to printed circuit board assemblies, and more specifically, to fixtures for aligning components during attachment to printed circuit board assemblies. While the present disclosure is not necessarily limited to such applications, various aspects of the disclosure may be appreciated through a discussion of various examples using this context.

Pin through-hole technology (also referred to herein as "PTH" technology) is sometimes used to create structural and electrical connections between the printed circuit boards in printed-circuit-board assemblies (also referred to herein as "PCBAs") and the components attached thereto (e.g., electrical connectors, power supplies). In typical applications of PTH technology, a component includes several conductive pins that are designed to be inserted into through holes on a printed circuit board (also referred to herein as a "PCB"). In typical use cases, the pins of the component provide electrical connectivity to the component, and the through holes on the PCB provide electrical connectivity to the other regions of the PCB and to other components attached thereto. Once the pins of a component are inserted into the intended through holes on a PCB the component pins can be soldered to the through hole. When performed properly, this may create a reliable structural and electrical connection.

Wave soldering is a common technique for soldering components to PCBs. In wave soldering, PCBs are typically placed on a track (such as a conveyor belt) and moved through a flowing wave of molten solder. The wave grazes the bottom of the PCBs, attaching to the through holes and the pins that are placed through the hole. Wave soldering is beneficial in some use cases in which many boards require soldering because wave soldering may be economically utilized at large scales.

However, because wave soldering includes moving PCB assemblies and passing through one or more fluids (e.g., flux and solder), it is sometimes possible for a component to become shifted during the wave soldering process. When a component shifts before or during wave soldering, it may result in incomplete structural or electrical connection between the component and the solder. In some instances, this may result in the PCBA functioning below its requirements or even in complete failure of the PCBA unless manual soldering rework is performed. Due to the expense of manual rework, PCBAs that function below requirements or fail may simply be discarded in cost-sensitive use cases.

For this reason, some wave soldering solutions utilize fixtures that press and hold the components to the PCB during wave soldering. Typical fixtures may be customized for a PCBA, which may involve manually developing/tweaking an apparatus for a PCBA, which adds to the expense of utilizing the fixtures. However, typical fixture components (e.g., rods that press components to PCBs) are also not precisely designed for a particular PCBA or component, and thus may be an imprecise method of securing components to a PCB for wave soldering. Further, typical solutions also require manual intervention when the components of a particular PCB are not well seated after the fixture is applied. Thus, while typical pressing fixtures do improve wave soldering yields, the expense, imprecision, and inflexibility of the fixtures are undesirable.

It is for these reasons that a pressing fixture that is more universally configurable and more adjustable is desired. Further, an automated method of applying a pressing fixture to a PCBA and adjusting for component defects and variability is also desired.

Some embodiments of the present disclosure provide a pressing fixture that includes an array of pressing devices that may individually be toggled from a pressing state to a non-pressing state. In some embodiments, for example, a pressing fixture may include a two-dimensional grid (i.e., intersecting rows and columns) of hundreds or even thousands of pressing devices. In some such embodiments, any pressing device may be in the grid may be automatically extended to press against a component on the PCBA or retracted to avoid contact with the component of PCB. In some embodiments, the pressing fixture may be attached to the PCBA (for example, with a clamp). This may decrease the likelihood that the pressing fixture or PCBA shifts with respect to the other during wave soldering. This may be beneficial because sufficient shifting of either the pressing fixture or the PCBA may cause a pressing device to shift out of place with respect to a component on which it was previously pressing, resulting in that component being insufficiently secured during wave soldering.

In some embodiments, each pressing device in the pressing fixture may take the form of a hollow screw with a weighted pin extending partially out of the screw and towards a PCBA. When the pressing device is rotated in the overall fixture, the pressing device may extend towards the PCBA. If the pressing device is extended sufficiently it may contact a component attached to the PCBA. Upon this contact, the weight of the pin may be pressing on the component, and extending the pressing device further toward the PCBA may cause the pin to be pushed into the hollow cavity of the screw. Thus, extending the pressing device past this point may not, in some situations, increase the weight applied to the component. In this way, the maximum weight that a single pressing device is capable of applying to the PCBA may be controlled and, if desired, fixed.

In some embodiments, an end of the weighted pin may rest on a spring that is coiled around the shaft of the pin within the cavity of the pressing device. In some such embodiments, the weight of the pin may cause the spring to compress within the cavity. In some embodiments, when the pressing device is extended such that the pin makes contact with a component on the PCBA, the weight of the pin may begin to be transferred from the spring to the component. When the pin initially makes contact, very little of the pin's weight will rest on the component. However, as the pressing device is extended further, the spring will begin to decompress, causing a larger proportion of the pin's weight to rest on the component. This may continue until the spring is fully decompressed, at which point the entirety of the pin's weight may rest on the component. In this way, the spring may not only protect the component from a sudden force of the pin's weight, but it may also allow the amount of the pin's weight that is applied to the component to be adjustable.

In some embodiments the pressing fixture may be utilized to customize the amount of pressing force that is applied to the components of the PCBA. For example, the pressing fixture may include of several rows and columns of pressing devices that are situated above the PCBA. In some embodiments, the pressing devices may be sufficiently small and closely spaced that some components on the PCBA are situated below multiple pressing devices. When one of these pressing devices is lowered onto one of those components, the pressing device may apply the weight of one pin onto the component. If it is determined that the weight of one pin is likely to be insufficient to keep the component seated during wave soldering, a second pressing device may be lowered, causing the weight of a second pin to press onto the component. Similarly, if it is determined that the pressing force on the component is not sufficiently evenly distributed (for example, if the component is tilting because six pins are pressing on one end and only one pin is pressing on the other end), some pressing devices may be retracted and other pressing devices may be lowered, redistributing the area of the component to which the pressing devices are applying force.

Some embodiments of the present disclosure may also take the form of a method of automatically applying a pressing fixture to a PCBA with minimal or no manual involvement. For example, when a PCBA that is to be pressed is obtained, it may be loaded into the pressing fixture manually or automatically (for example, using a robotic arm). When the PCBA is in the fixture, the PCBA may be reviewed to determine whether an historical pressing plan is available for the PCBA. In some embodiments, this review may involve a video camera analyzing the PCBA for properties that may identify the PCBA (e.g., PCB dimensions, component count, component size, component locations, serial numbers printed on the board). This video data may be analyzed by a computer system that is configured to compare the PCBA properties to the properties of previously soldered PCBAs. In some embodiments, the computer system may also have access to design files for the PCBA (e.g., schematic files, computer-animated-design files, a product manual, a part list, etc.).

If the computer system is able to identify the PCBA, it may then determine if an historical pressing plan is available for the PCBA. A pressing plan may include, for example, the identities of the pressing devices that should be lowered to press on components of the PCBA. Further, in embodiments in which the pressing devices comprise springs, a pressing plan may also include the extent to which each pin should be lowered. This may, for example, provide further control over the distribution of force over one or more components.

If an historical pressing plan for the PCBA is available, the computer system may extend the pressing devices identified by the historical pressing plan. In some embodiments, for example, the computer system may control a driver (e.g., a screwdriver, a socket driver) that is capable of navigating to any pressing device on the pressing fixture. The computer system may navigate the driver to each identified pressing device and cause the driver to rotate the pressing device, causing the pressing device to advance into its threaded hole. If applicable, the computer system may identify the extent to which each pressing device should be advanced in the historical pressing plan and may cause the driver to rotate each pressing device only as many revolutions as is necessary to advance to that extent.

If an historical pressing plan is not available the computer system may obtain a map of the components on the PCB and determine, based on the component locations, the particular pressing devices to extend to press on those components. The identities/locations of those pressing devices may then be stored in a pressing plan for the PCBA for future use.

In some embodiments, the computer system may also have access to one or more images of the bottom of the PCB from one or more cameras (e.g., video cameras, still image cameras). The computer system may analyze the pins of each component in these images after having extended the pressing devices to the PCBA components. The orientation of the pins (for example, if the pins extend out of the through holes perpendicular to the PCB surface) and the extent to which the pin is visible (for example, the percentage of the pin that extends past the through hole) may be used to determine whether the components are well seated. For example, if a component's pins appear tilted, it may be likely that the component is tilted. Similarly, one or more if the component's pins is not extending past the through hole a sufficient amount, it may be likely that the component is not fully inserted onto the PCBA.

If the computer system determines that all components are well seated, the computer system may approve the PCBA for wave soldering. In some embodiments, the pressing fixture and PCBA may already be on a wave-soldering conveyor belt (also referred to herein as a "conveyor track"), in which case the computer system may simply advance the conveyor belt. If, however, the computer system determines that one or more component is tilted, the computer system may retract some pressing devices, extend more pressing devices, or alter the extent to which some pressing devices are extended. In some embodiments, the computer system may continue to configure the pressing devices until all components are well seated.

FIGS. 1A and 1B depict two views of an example pressing device 100 that may be incorporated into an array of pressing devices in a pressing fixture. FIG. 1A discloses an exterior view of pressing device 100, which takes the form of a hollow screw body 102 with a hexagonal screw head 104. Three faces 106, 108, and 110 of the screw head are visible in FIG. 1A. As illustrated, face 108 is oriented parallel to the plane of the paper on which FIG. 1A may be printed, whereas faces 106 and 110 are each tilted 60 degrees into the paper.

Pressing device 100 also includes spiral threads 112, which may correspond with threads in the holes of a pressing fixture into which pressing device 100 may be inserted. Screw head 104 may be rotated by a hex-socket-style driver, which may cause pressing device 100 to advance in the hole or retract, based on the direction of rotation and orientation of threads 112.

Pressing device 100 includes pin 114. Two components of pin 114 are visible in FIG. 1A: pin shaft 116 and pin end 118. Pin 114 is shown extending out of the bottom of the tip of screw body 102. Thus, as pressing device 100 is lowered onto a component, pin end 118 will contact the component.

FIG. 1B discloses an alternate view of pressing device 100 with the interior components of pressing device 100 (i.e., the components within the interior cavity of screw body 102) exposed. In addition to the components disclosed in FIG. 1A, FIG. 1B also discloses a second pin end 120 and a spring that is coiled around the portion of pin shaft 116 that is positioned in the interior cavity of pressing device 100. The spring comprises a spring body 122, a first spring end 124, and a second spring end 126. Second pin end 120 is, as illustrated, resting on first spring end 124 such that the spring is supporting the weight of pin 114. Spring end 126 is resting on the bottom of the interior cavity of screw body 102, which is preventing the spring from exiting the interior cavity. The weight of pin 114 applied to spring end 124 is pushing spring end 124 towards spring end 126. However, because spring end 126 cannot move, this results in spring body 122 being compressed.

If pin 114 were pushed up with respect to screw body 102 (or if screw body 102 were pushed down with respect to pin 114) pin 114 would advance into the hollow cavity of screw body 102 causing pin end 120 to move up into the interior cavity. Spring end 124 would then also move up, causing spring body 122 to decompress. Once spring body 122 is fully decompressed, causing pin 114 to advance any further into the interior cavity would result in no weight of pin 114 resting on the spring.

In some embodiments, the extension of pressing devices with internal springs may be viewed as having three significant stages. In the first stage, the pressing device is being lowered towards a component, but the pin has not yet made contact with the component. At the end of the first stage (or, alternatively, the beginning of the second stage), the pin makes initial contact with the component, but the spring is still compressed. If the pressing device is extended past the point of initial contact, it enters the second stage. In the second stage, the pin extends into the cavity of the pressing device as the pressing device is extended towards the component. This causes the spring to decompress. At the end of the second stage (or, alternatively, the beginning of the third stage), the pin has extended into the cavity to a sufficient extent that the spring is completely decompressed. This point is referred to as the point of complete contact. If the pressing device is extended towards the component past the point of complete contact, the pin continues to extend into the cavity of the pressing device, creating a gap between the pin end and the decompressed spring.

Figure 2B:
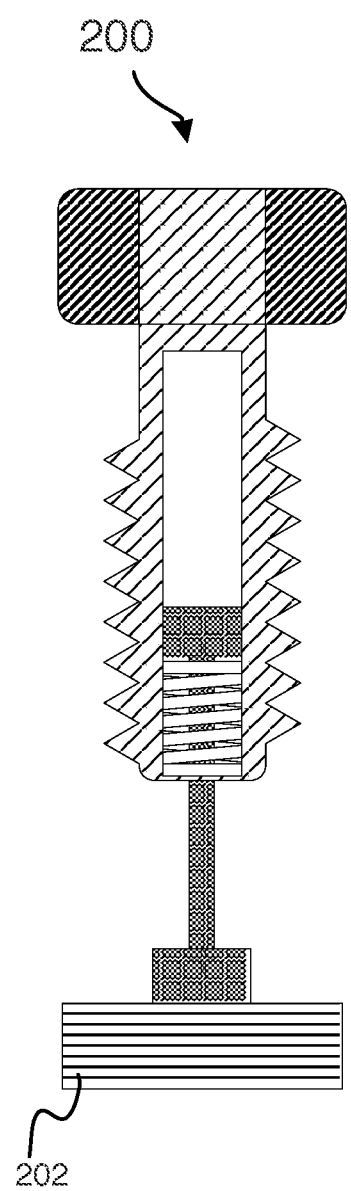
FIG. 2B depicts a second view of a component pressing device that has been partially lowered onto a PCBA component in accordance with the embodiments of the present disclosure.
Figure 2C:
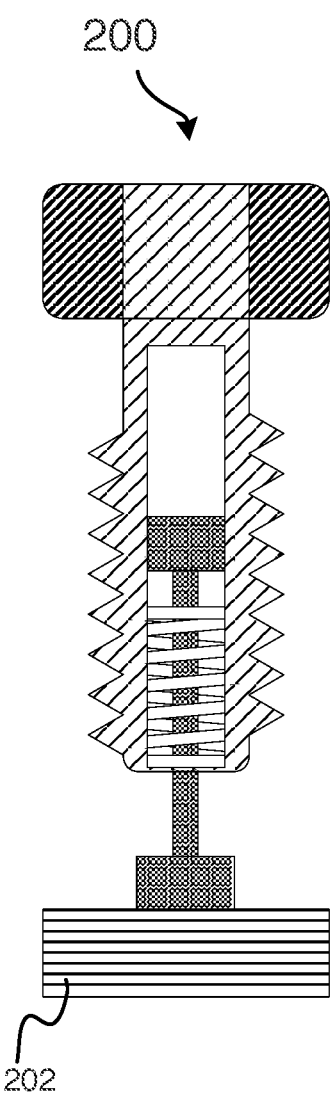
FIG. 2C depicts a third view of a component pressing device that has been lowered onto a PCBA component in accordance with the embodiments of the present disclosure.

FIGS. 2A, 2B, and 2C illustrate several views of a pressing device 200 passing through these three stages. In FIG. 2A, pressing device 200 is positioned above component 202. Pressing device 200 may be in a process of being lowered towards component 202, but it has not yet made initial contact with component 202. For this reason, all of the weight of the pin inside pressing device 200 is resting on the spring. In FIG. 2B, however, pressing device 200 is making initial contact with component 202. The fact that FIG. 2B is illustrating the point of initial contact is evident because the spring in pressing device 200 is shown to be equally compressed in FIGS. 2A and 2B.

Thus, the spring has not yet begun to decompress in FIG. 2B, which suggests that all (or nearly all) of the weight of the pin is still on the spring and not on component 202. However, as pressing device 200 is extended toward component 202 past the point of initial contact, the pin will extend further into the interior cavity of pressing device 200, causing the spring to decompress. As the spring decompresses, the spring will apply less force to the pin (i.e., the spring will push up against the pin less), causing more of the weight of the pin to push down against component 202. When the pressing device is extended to the point of complete contact, the spring will be completely decompressed, and all (or nearly all) of the weight of the pin will be pressing down on component 202. Further, as pressing device 200 is extended toward component 202 past the point of complete contact, pressing device will enter the third stage.

FIG. 2C illustrates pressing device 200 in the third stage. In FIG. 2C, the pin has separated from the spring, and the spring is fully decompressed. However, at the time illustrated in FIG. 2C, the weight applied to component 202 has not increased since the point of complete contact. Rather, the weight applied to component 202 is still the weight of the pin. This prevents excess force from being applied to component 202, which also prevents damaging component 202 or unseating component 202 from the PCB.

As has been discussed, in some embodiments of the present invention, multiple pressing devices may be arranged in an array (e.g., a grid of rows and columns) in a pressing fixture. This may be beneficial, for example, because it would allow multiple pressing devices to apply force to components on a PCB together, providing a high amount of configurability to the fixture.

Figure 3:
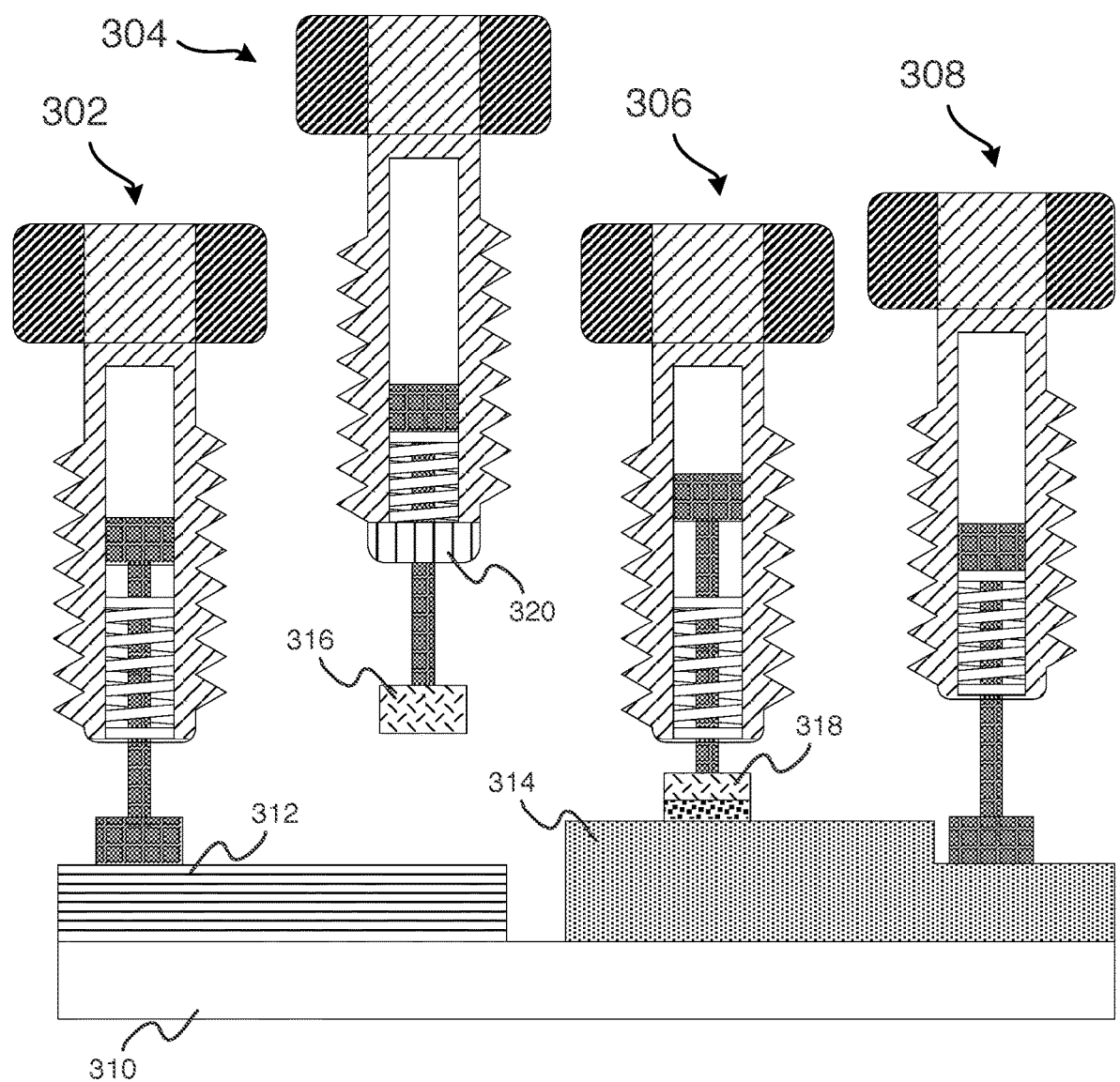
FIG. 3 depicts a set of component pressing devices that are lowered in various configurations onto PCBA components in accordance with the embodiments of the present disclosure.

FIG. 3 illustrates a set of four pressing devices 302-308 that may be arranged in an array in a pressing fixture that is securing components to PCB 310. As illustrated, component 312 is located below pressing devices 302 and 304, whereas component 314 is located below pressing devices 306 and 308. In the embodiment shown, component 312 is being pressed by pressing device 303 but not pressing device 304. This may be, for example, because it has been determined that component 312 needs only the force of one pressing device to stay well seated, and it may be that most of the contact pins on 312 are beneath pressing device 302. Thus, it may be advantageous to distribute most of the force above those pins to keep them well seated. However, if it is determined that component 312 is not sufficiently seated (e.g., the right side of component 312 is shifting during wave soldering), pressing device 304 could be partially or completely lowered onto component 312.

Component 314 is being pressed by pressing devices 306 and 308. Even though component 314 has inconsistent height across the width of the component, pressing devices 306 and 308 are both able to press down on each section of component 314, preventing one side of component 314 from raising off PCB 310. This configurability enables the embodiments of the present disclosure to press irregularly shaped and placed components without designing manual pressing fixtures to account for those components.

Like pressing device 302, pressing device 306 has been extended past the point of complete contact, and thus the pin inside pressing device 306 is not being supported by the spring. Rather, the entire weight of the pin is resting on component 314. As illustrated, component 314 is taller than component 312, and pressing devices 302 and 306 have been lowered to the same height above PCB 310 (as is evident by the equal heights of the screw heads of pressing devices 302 and 306). However, because the pins of pressing devices 302 and 306 are able to extend into the cavities inside pressing devices 302 and 306, lowering pressing devices 302 and 306 past the point of complete contact does not increase the force that is applied to their respective components. Thus, even though component 306 is extended further past the point of complete contact than component 302 is (as evident by the greater proportion of spring in pressing device 306 than pressing device 302), both pressing devices are applying an equal force to their respective components.

However, pressing device 308, which is contacting component 314, has not been extended to the point of complete contact. This is evident by the fact that the pin inside pressing device 308 is still resting on the spring, and the spring is compressed further (the coils are closer together) than the springs in pressing devices 302 or 304. Thus, the spring in pressing devices 308 is still pushing up against the pin, preventing the pin's full weight from being applied to component 314. This may be beneficial, for example, if evenly distributing the force on both sides of component 314 would cause component 314 to tilt.

Further, pressing devices 304 and 306 have been illustrated with different features that may beneficial pressing-device features in some embodiments. While these features are only found on pressing devices 304 and 306, in some embodiments these any of these features may be found on any combination of pressing devices that are part of a pressing fixture.

For example, pressing device 304 is illustrated with a lower pin end 316 that takes the form of a removable weight. For example, pin end 316 may be screwed on to the pin shaft in pressing device 304. If more weight were required to press a component, however, pin end 316 could be removed and replaced by a heavier pin end. Alternatively, pin end 316 could be removed and replaced with a lighter pin end. Pressing device 306 also is illustrated with a customized pin end. Pin end 318 is illustrated with two sections—the section that is making contact with component 314 may be, for example, a soft pad (e.g., a rubber pad), and the section that is resting on top of that section may be a weighted disk. In some embodiments, for example, the friction between the soft portion of the pin end and the pin shaft may prevent the soft pad from falling off. This may also prevent the weighted disk from falling off the shaft. In some instances, it may also be beneficial to contact a component with a soft pad rather than a hard weight, because a hard weight may be more likely to damage a component.

Finally, pressing device 304 also contains screw cap 320. Screw cap 320 may fit over the opening to the cavity inside pressing device 304, which may prevent the spring and pin inside from falling out of the interior cavity. This design may make manufacturing the screws with interior cavities significantly easier, and may enable springs and pins to be replaced periodically or as needed.

Figure 4:
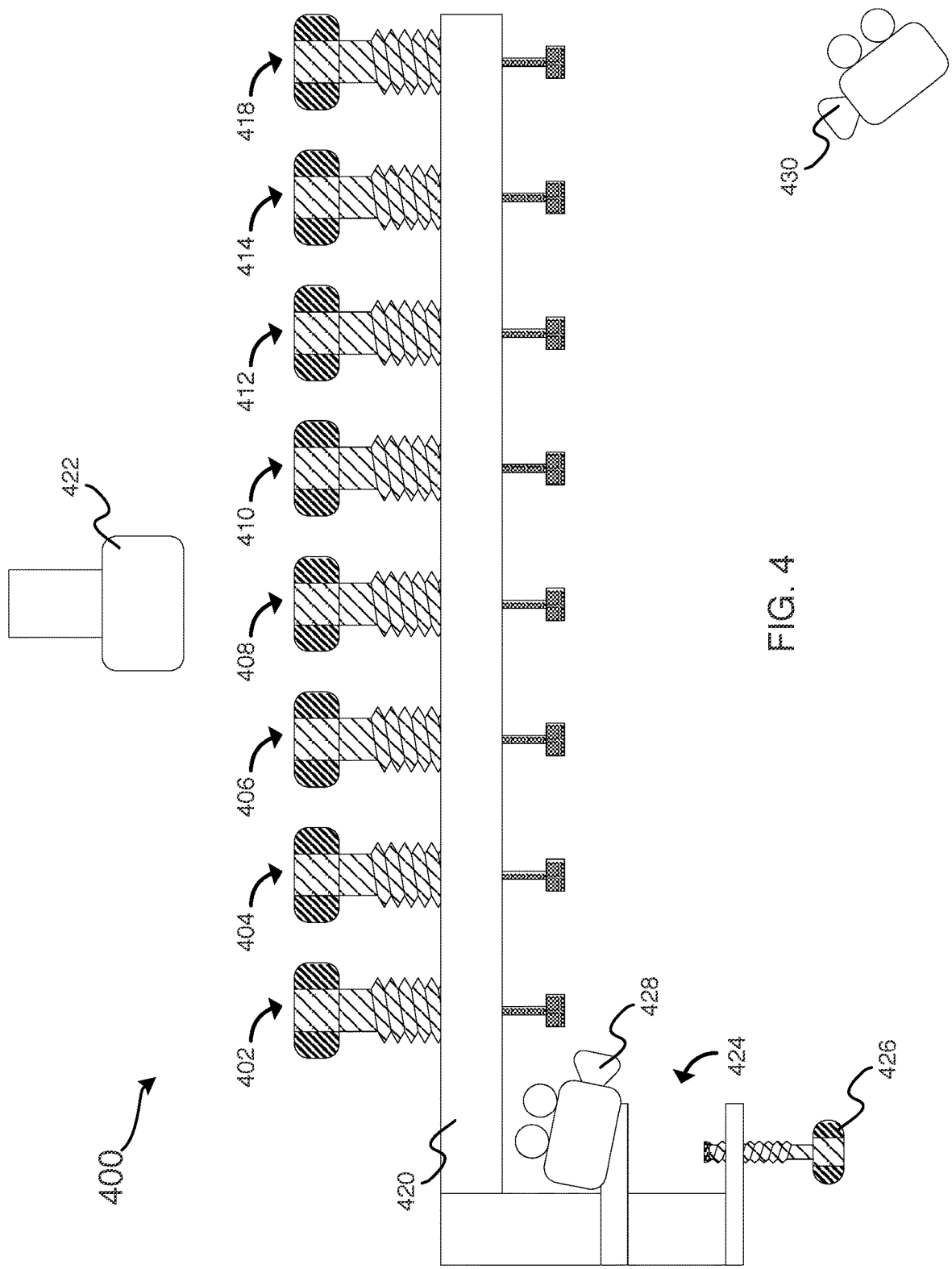
FIG. 4 depicts a configurable component pressing fixture with an array of component pressing devices in accordance with the embodiments of the present disclosure.

FIG. 4 expands upon the concept of inserting an array of pressing devices into a pressing fixture 400. FIG. 4 illustrates pressing devices 402 through 418, which may represent one partial row of pressing devices of a grid of hundreds pressing devices. Pressing devices 402 through 418 may be inserted into threaded holes in fixture plate 420. FIG. 4 also illustrates driver 422, which may be capable of moving to any pressing device in the array of pressing devices and rotating the pressing device to raise it away from components on the PCB or lower it towards components on the PCB. Driver 422 may, for example, be part of a larger apparatus on or under which fixture plate has been mounted. The apparatus may have mechanical motors and joints capable of moving driver 422 in three dimensions. In other embodiments, driver 422 may be manually operated (for example, driver 422 may be a hand-held drill or impact driver).

Driver 422 could be used to engage or disengage the any of pressing devices 402-418. For example, the driver could automatically navigate to pressing devices 402, 404, 408, 412, and 414 and rotate them until they are fully extended (for example to the point at which the screw heads touch fixture plate 420. Those pressing devices may then make contact with components on a PCB attached to pressing fixture 400, which may cause those components to stay seated during wave soldering. However, if needed, one or more of pressing fixtures 406, 410, and 416 could also be lowered to redistribute force or apply more weight to a component.

Pressing fixture 400 also contains clamp 424, which represents a mechanism by which a PCBA may be secured to pressing fixture 400. Securing a PCBA to pressing fixture 400 may help to prevent the PCBA from shifting during or leading to wave soldering, which could potentially result in the pressing devices 402 though 418 not being aligned with electrical components on the PCBA. Clamp 424 contains clamp screw 426, which may be rotated to close clamp 424 onto a PCBA.

Pressing fixture 400 also includes camera 428, which may be a still camera or a video camera. Camera 428 may be useful for recording images of the top of a PCBA before pressing devices are applied. This may be beneficial in order to identify the PCBA and determine whether an historical pressing plan is available. This may also be beneficial to determine if there are any components that are defectively inserted onto the PCB (e.g., a component that was not aligned with the through holes on the PCB, causing a component pin to not be placed over a solid portion of the PCB, rather than over a through hole). These images can also be used to map out components on the PCB and identify corresponding pressing devices that should be extended.

Pressing fixture also includes camera 430, which may also be a still camera or a video camera. Camera 430 may be useful for recording images of the bottom of the PCBA after it has been inserted into the fixture (e.g., after some of pressing devices 402 through 418 have been extended towards the PCBA). Camera 430 may thus allow automated inspection of the bottom of the PCBA after pressing devices have been lowered onto the PCBA. This may enable a computer system that is analyzing the pictures to determine whether all components are sitting evenly on the PCB and whether some pressing devices may need to be fully or partially extended, or whether some pressing devices may need to be fully or partially retracted.

In the embodiment illustrated in FIG. 4, only one top-side camera and one bottom-side camera are shown. However, in some embodiments several cameras may be present. Further, while camera 428 is shown attached to clamping device 424 and camera 430 is shown as separate from pressing fixture 400, in some embodiments some cameras may be separate from pressing fixture 400 and some cameras may be attached. As illustrated, the position and form of cameras 428 and 430 are solely for the sake of understanding. In some embodiments, for example, cameras may travel with fixture plate 420 (and attached PCBA) to the wave-soldering process, whereas in other embodiments they may depart from fixture plate 420 (and attached PCBA) when fixture plate 420 is conveyed to the wave-soldering machine.

Pressing fixture 400 may be attached to, or part of, a conveyor system that is configured to move PCBAs through the wave-soldering process. For example, fixture plate 420 may be permanently or temporarily attached at any of its four sides or any combination of its four sides.

In some embodiments, for example, pressing fixture 400, cameras 428-430 and driver 422 may be attached to a larger wave-soldering apparatus with a conveyor system, the start of which (for example, the beginning of the conveyor track) may be the location at which the PCBA is attached to fixture plate 420 with clamp 424. Once the PCBA has been attached to fixture plate 420, camera 428 may record images of the top surface of the PCBA, which may be reviewed for identification purpose and defects. Driver 422 may be attached to an automated mechanism at the start of the conveyor system. This automated mechanism may navigate driver 422 to any of the pressing devices 402-418. Driver 422 may have instructions to engage certain pressing devices (e.g., pressing devices 402, 408, and 412). Once those pressing devices are engaged, camera 430 may record images of the bottom surface of the PCBA, which may be reviewed to determine whether all components are properly seated. Once all components are properly seated, the conveyor system may be activated, at which point fixture plate 420 may move through the wave soldering process, carrying clamp 424, pressing devices 402-418, and the clamped-and-pressed PCBA with it.

Figure 5:
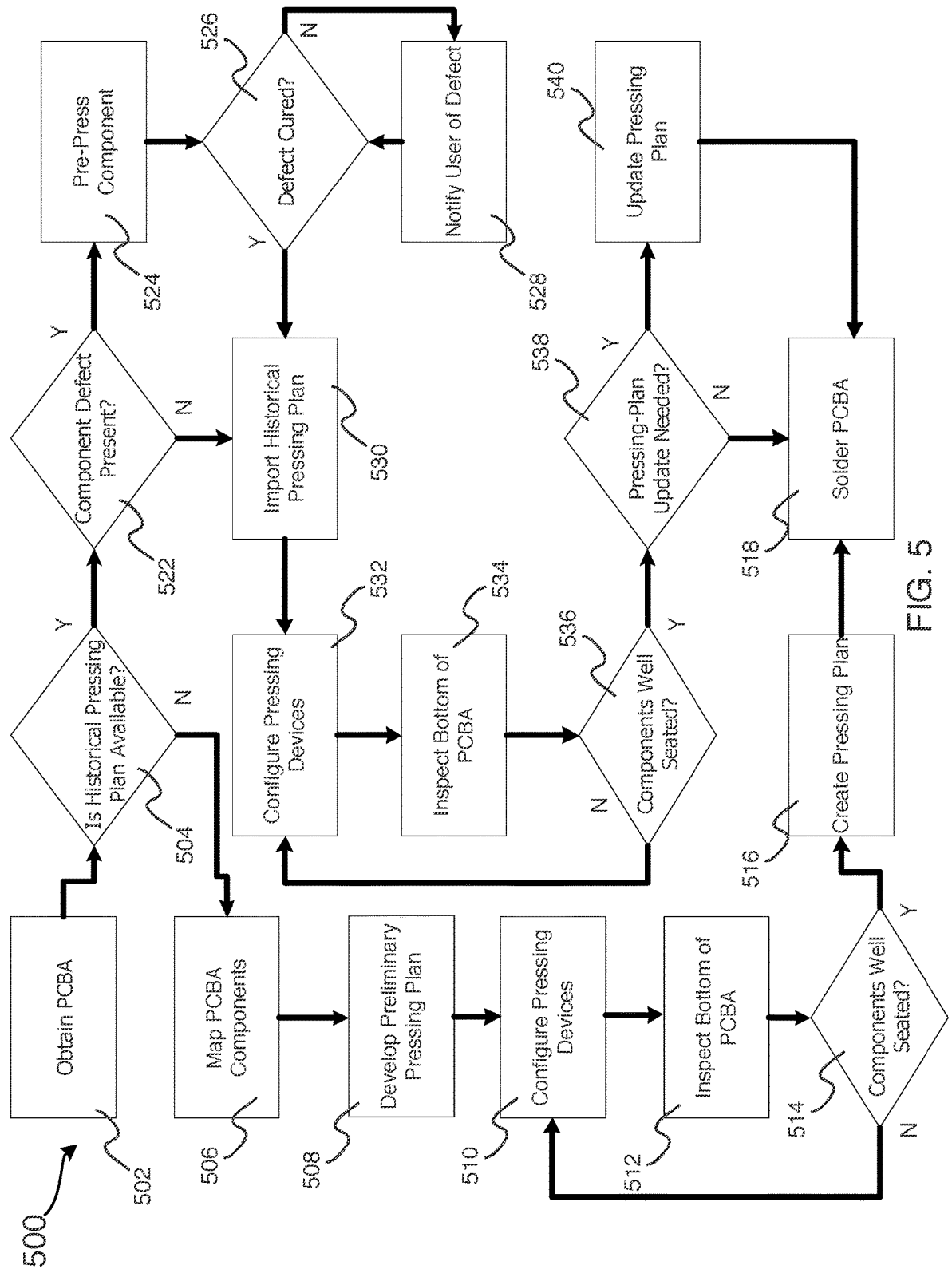
FIG. 5 depicts an example method of automatically operating a configurable component pressing fixture in accordance with the embodiments of the present disclosure.
Figure 6:
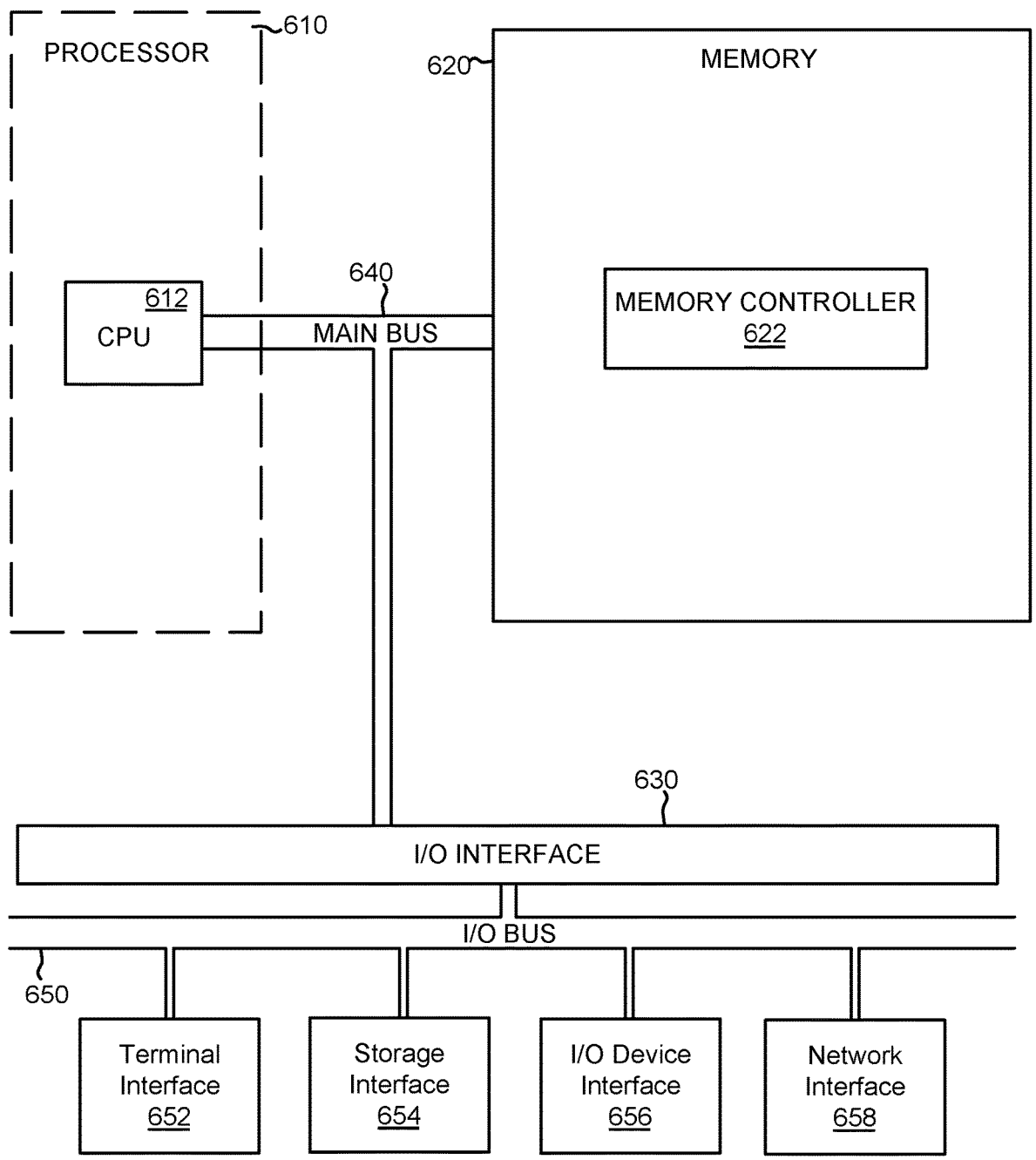
FIG. 6 depicts the representative major components of a computer system that may be used in accordance with embodiments.

FIG. 5 illustrates an example method 500 by which a PCBA could be automatically analyzed, pressed, and sent to wave soldering, in accordance with embodiments of the present disclosure. Method 500 may be operated by a computer system that has access to images of a PCBA (for example, through configured to record images of the top and bottom of the PCBA after it has been inserted into a pressing fixture), control over a driver to engage and disengage (or, in some embodiments, raise and lower) pressing devices, access to PCBA identification information and historical pressing plans for PCBAs that have been previously pressed and wave soldered. Computer system 600, discussed in connection with FIG. 6, is an example of such a computer system, and the embodiments discussed in FIG. 4 are examples of apparatuses that may be controlled through method 500.

Method 500 begins with block 502, in which a PCBA is obtained. In some embodiments, obtaining the PCBA may include inserting some components manually onto the PCB of the PCBA. In some embodiments, all components may already be temporarily affixed to the PCBA. In some embodiments, obtaining the PCBA may also include attaching the PCBA to a pressing fixture (e.g., clamping the PCBA to a fixture plate) on a conveyor system. After the PCBA is obtained, the system determines whether an historical pressing plan is available for the PCBA in block 504. In some embodiments, this may include identifying the PCBA, which may be performed in several ways. In some instances, for example, the model number of the PCBA may be uploaded to the computer system performing method 500 when the PCBA is obtained. In other instances, for example, the computer system may analyze images of the PCBA using cameras pointed at the top or bottom of the PCBA. This may include searching the PCBA for identifying information (e.g., a solder-masked model number on the PCB) or analyzing the properties of the PCBA (e.g., the dimensions of the PCB and the dimensions and placement of the components on the PCB). Once the PCBA is identified, the system may determine whether an historical pressing plan is available for the identified PCBA. In some embodiments, this may include searching a list of historical pressing plans for data matching that PCBA model number. In other embodiments, this may take the form of analyzing historical pressing plans for a PCBA with similar (or exact) properties to the identified PCBA.

If an historical pressing plan is not identified in block 504, the computer system maps the PCBA components in block 506. In some embodiments, this may utilize one or more cameras that are recording images of the PCBA. In other embodiments, component mapping data may have been provided with the PCBA, in which case that mapping data may be uploaded into the computer system performing method 500.

After the components of the PCBA are mapped, a preliminary pressing plan for the PCBA is developed in block 508. This preliminary pressing plan may identify the pressing devices that should be extended to apply force to PCBA components and, in some embodiments, the amount to which those pressing devices should be extended.

In some embodiments, developing a preliminary pressing plan may include inspecting the PCBA by a visual-image camera or a laser imager, for example. In embodiments in which the PCBA has already been loaded into the pressing fixture (for example, in block 502), the bottom of the PCBA may be inspected. In embodiments in which the pressing fixture is not yet covering the top of the PCBA, however, the top of the PCBA may be inspected. This inspection may include determining whether all components are placed on the PCB in the correct spot, such that all component pins align with an intended through-hold. From the bottom side, for example, this inspection may include verifying that all component pins that should be extended through the PCB are indeed extended through the PCB. This may help to identify board defects such as a component being placed in the wrong orientation, being placed in the wrong location, or the wrong component being placed. If defects are discovered, they may be accounted for in a preliminary pressing plan (if possible), or manually corrected.

Developing a preliminary pressing plan in block 508 may also include analyzing how each component is seated on the PCB. This information may then be used in developing the preliminary pressing plan. For example, a broad component situated over several through holes (e.g., a power supply or connector) that seems to naturally tilt on the PCB may require several pressing devices to secure, whereas a narrow, short, and heavy component (e.g., a ferrite choke) may only require a single pressing device to secure. Similarly, a component with multiple heights (e.g., a component with another PCB mounted thereto) may require more pressing devices to distribute pressing force throughout the component, but pressing devices located over a change in height (e.g., the edge of a sub-component mounted onto the components) may not be engaged to avoid tilting the component.

After a preliminary pressing plan is developed in block 508, the pressing devices identified by that preliminary plan are configured according to the preliminary pressing plan in block 510. This may involve, for example, an automated driver (e.g., a socket driver) navigating to and rotating each pressing device identified by the preliminary pressing plan. In some embodiments this may also involve determining how far to advance each pressing device, and rotating each pressing device only so far as is necessary to advance to that degree.

Once the pressing devices have been extended in block 510, the bottom of the PCBA is inspected in block 512. This inspection may be performed, for example, by a video camera or laser-based depth detector to determine the angle and length of each component pin past the PCB. Using the information gathered from block 512, the computer system performing method 500 may determine in block 514 whether each component on the PCBA is well seated. If the computer system determines in block 514 that one or more components is not well seated, the computer system may return to block 510 to configure the pressing devices again. In some embodiments, this may include extending more pressing devices, retracting some previously extended pressing devices, or changing the degree to which some previously extended pressing devices are extended.

While method 500 illustrates a loop between 510, 512, and 514, in some embodiments manual intervention may be required if the computer system determines that the components are not well seated in block 514. Thus, in some embodiments of the present disclosure that are not illustrated by method 500, determining that the components are not well seated after the pressing devices are configured according to a preliminary pressing plan may include notifying a user that manual intervention is required.

If, however, the computer system determines in block 514 that the components are well seated, the computer system may create and store a pressing plan entry for the PCBA in block 516 for future use. This pressing plan may contain, for example, identifying information for the PCBA, properties of the PCBA, identities/locations of the pressing devices extended and retracted throughout the iterations of blocks 510 through 514, and the extent to which those pressing devices were extended and retracted. After the pressing plan is created in block 516, the computer system may send the PCBA (with pressing fixture) to be soldered in block 518. In some embodiments, this may include activating a conveyor belt on which the PCBA and pressing fixture have been mounted.

On the other hand, in some instances an historical pressing plan for the PCBA will be identified in block 504. This may be the case, for example, if the PCBA obtained in block 502 is a PCBA that has been pressed and soldered by the computer system before. If an historical pressing plan for the PCBA is identified in block 504, the computer system analyzes the PCBA and determines whether a component defect is present in block 522.

In some embodiments, for example, a PCBA may not have already been loaded onto the pressing fixture, in which case an inspection of the top of the PCBA may be performed. In some embodiments, the PCBA may have already been inserted into the pressing fixture, in which case an inspection of the bottom of the PCBA may be performed. This inspection may attempt to determine, for example, whether any components are missing, oriented incorrectly, or located incorrectly on the PCB.

If a component defect is identified in block 522, the computer system attempts to correct the defect in block 524 by prepressing the component. Prepressing the component may include, for example, mounting the PCBA in the pressing fixture and engaging a small number of pressing devices (e.g., one) for each component that is defective. This may, in some instances, cause a component that has shifted out of place, for example, to shift back to its desired position.

In block 526, the system determines whether the defect has been cured by the pre-pressing. This may involve the same information that was utilized to determine that the defect was present in block 522. If the defect has not been cured, it may be an indication that the defect requires manual attention, and thus the system may notify a user of the defect in block 528. After notifying the user of the defect, the system returns to block 526 to determine whether the defect has been cured. In some embodiments, this may involve waiting for a user to confirm that the defect has been cured. In other embodiments, the system may repeatedly repeat 526 until the defect is cured.

If the system determines that the defect is cured in block 526, of if the system determines in block 522 that no component defect is present, the historical pressing plan identified in block 504 is imported in block 530. In block 532, the pressing devices of a pressing fixture are configured according to that historical pressing plan. This may include similar steps to those performed in block 510. After the pressing devices are configured in block 532, the bottom of the PCBA is inspected in block 534, and that information is used to determine whether the PCBA components are well seated in block 536. The steps in these blocks may be similar to the steps performed in blocks 512 and 514.

If the system determines in block 536 that the components are not well seated, the system alters the configuration of the pressing devices in block 532 and reinspects the PCBA in block 534, after which block 536 can be repeated with the updated configuration. If, however, the system determines in block 536 that the components are well seated, the system determines in block 538 whether an update to the pressing plan that was imported in block 530 is needed. An update to the pressing plan may be needed, for example, if the system determined in block 536 that the components were not well seated and altered the configuration of the pressing devices in a second (or subsequent) iteration of block 532.

If the system determines that a pressing-plan update is needed in block 538, the system updates the imported pressing plan in block 540. This update may reflect the alterations performed on the pressing devices in a second (or subsequent) iteration of block 532.

After the pressing plan is updated in block 540, or after the computer system determines that the pressing plan does not need to be updated in block 538, the computer system may send the PCBA (with pressing fixture) to be soldered in block 518. As discussed previously, this may include activating a conveyor belt on which the PCBA and pressing fixture have been mounted.

FIG. 6 depicts the representative major components of an example Computer System 601 that may be used in accordance with embodiments of the present disclosure. The particular components depicted are presented for the purpose of example only and are not necessarily the only such variations. The Computer System 601 may include a Processor 610, Memory 620, an Input/Output Interface (also referred to herein as I/O or I/O Interface) 630, and a Main Bus 640. The Main Bus 640 may provide communication pathways for the other components of the Computer System 601. In some embodiments, the Main Bus 640 may connect to other components such as a specialized digital signal processor (not depicted).

The Processor 610 of the Computer System 601 may include one or more CPUs 612. The Processor 610 may additionally include one or more memory buffers or caches (not depicted) that provide temporary storage of instructions and data for the CPU 612. The CPU 612 may perform instructions on input provided from the caches or from the Memory 620 and output the result to caches or the Memory 620. The CPU 612 may include one or more circuits configured to perform one or methods consistent with embodiments of the present disclosure. In some embodiments, the Computer System 601 may contain multiple Processors 610 typical of a relatively large system. In other embodiments, however, the Computer System 601 may be a single processor with a singular CPU 612.

The Memory 620 of the Computer System 601 may include a Memory Controller 622 and one or more memory modules for temporarily or permanently storing data (not depicted). In some embodiments, the Memory 620 may include a random-access semiconductor memory, storage device, or storage medium (either volatile or non-volatile) for storing data and programs. The Memory Controller 622 may communicate with the Processor 610, facilitating storage and retrieval of information in the memory modules. The Memory Controller 622 may communicate with the I/O Interface 630, facilitating storage and retrieval of input or output in the memory modules. In some embodiments, the memory modules may be dual in-line memory modules.

The I/O Interface 630 may include an I/O Bus 650, a Terminal Interface 652, a Storage Interface 654, an I/O Device Interface 656, and a Network Interface 658. The I/O Interface 630 may connect the Main Bus 640 to the I/O Bus 650. The I/O Interface 630 may direct instructions and data from the Processor 610 and Memory 620 to the various interfaces of the I/O Bus 650. The I/O Interface 630 may also direct instructions and data from the various interfaces of the I/O Bus 650 to the Processor 610 and Memory 620. The various interfaces may include the Terminal Interface 652, the Storage Interface 654, the I/O Device Interface 656, and the Network Interface 658. In some embodiments, the various interfaces may include a subset of the aforementioned interfaces (e.g., an embedded computer system in an industrial application may not include the Terminal Interface 652 and the Storage Interface 654).

Logic modules throughout the Computer System 601—including but not limited to the Memory 620, the Processor 610, and the I/O Interface 630—may communicate failures and changes to one or more components to a hypervisor or operating system (not depicted). The hypervisor or the operating system may allocate the various resources available in the Computer System 601 and track the location of data in Memory 620 and of processes assigned to various CPUs 612. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A pressing device comprising:
   a screw body comprising:
      a screw head that comprises a driver interface;
      a screw shaft comprising:
         a screw tip opposite the screw head with respect to the screw shaft;
         exterior spiral threads between the screw head and screw tip; and
         an interior cavity with an opening at the screw tip;
   a pin partially inserted into the interior cavity, the pin comprising:
      a first pin end inserted into the interior cavity;
      a pin shaft that is connected to the first pin end; and
      a second pin end that is connected to the pin shaft and that is exterior to the interior cavity; and
   a spring inserted into the interior cavity, wherein the spring comprises:
      a spring body;
      a first spring end located between the spring body and the screw head;
      a second spring end located between the spring body and the screw tip;
   wherein the pin is capable of advancing into the interior cavity, wherein the spring is coiled around the pin shaft, and wherein a weight of the pin applied to the first spring end causes the spring to compress.

2. The pressing device of claim 1, wherein the second pin end comprises a soft pad.

3. The pressing device of claim 1, wherein the second pin end is removable.

4. The pressing device of claim 1, wherein the pressing device further comprises a screw cap inserted onto the screw shaft, wherein the screw cap prevents the pin from completely exiting the interior cavity.

5. A pressing fixture comprising:
   a fixture plate comprising a set of threaded holes;
   a set of threaded pressing devices inserted partially into the threaded holes, each threaded pressing device comprising:
      a screw body comprising:
         a screw shaft that comprises exterior spiral threads and an interior cavity;
         a screw head that comprises a driver interface;
      a pin partially inserted into the interior cavity, the pin comprising:
         a first pin end inserted into the interior cavity;
         a pin shaft that is connected to the first end; and
         a second pin end that is connected to the pin shaft and that is exterior to the interior cavity;
      a spring inserted into the interior cavity;
      wherein the pin is capable of advancing into the interior cavity, and wherein the spring is coiled around the pin shaft;
   wherein rotating a pressing device in the set of pressing devices in a first direction of rotation that is parallel to the fixture plate causes the pressing device to move in a first axial direction that is perpendicular to the fixture plate and wherein rotating the pressing device in a second direction of rotation that is opposite the first direction of rotation causes the pressing device to move in a second axial direction that is opposite the first axial direction.

6. The pressing fixture of claim 5, wherein the pressing fixture also comprises a clamp attached to the fixture plate, wherein the clamp is configured to secure a printed-circuit-board assembly to the pressing fixture.

7. The pressing fixture of claim 5, wherein the pressing fixture also comprises a driver that is configured to interface with and rotate the pressing device in the set of pressing devices.

8. The pressing fixture of claim 5, wherein the fixture plate is mounted on a conveyor track that is configured to move the pressing fixture through a wave-soldering machine.

9. The pressing fixture of claim 5, wherein the spring comprises a first spring end and wherein a weight of the pin applied to the first spring end causes the spring to compress.

10. The pressing fixture of claim 9, wherein the spring further comprises:
    a spring body; and
    a second spring end located between the spring body and the screw tip;
    wherein the first spring end is located between the spring body and the screw head.

11. A method of pressing a component for a first printed circuit board assembly to a printed circuit board, the method comprising:
    inserting the printed circuit board into a pressing fixture wherein the pressing fixture comprises:
       a fixture plate comprising a set of threaded holes;
       a set of threaded pressing devices inserted partially into the threaded holes, each threaded pressing device comprising:
          a screw body comprising:
             a screw shaft that comprises exterior spiral threads and an interior cavity;
             a screw head that comprises a driver interface;
          a pin partially inserted into the interior cavity, the pin comprising:
             a first pin end inserted into the interior cavity;
             a pin shaft that is connected to the first end; and
             a second pin end that is connected to the pin shaft and that is exterior to the interior cavity;
          a spring inserted into the interior cavity;
          wherein the pin is capable of advancing into the interior cavity, and wherein the spring is coiled around the pin shaft;
       wherein rotating a pressing device in the set of pressing devices in a first direction of rotation that is parallel to the fixture plate causes the pressing device to move in a first axial direction that is perpendicular to the fixture plate and wherein rotating the pressing device in a second direction of rotation that is opposite the first direction of rotation causes the pressing device to move in a second axial direction that is opposite the first axial direction;
    determining that a historical pressing plan is not available for the printed circuit board;
    mapping a set of components on the first printed circuit board assembly;
    extending the set of pressing devices to the set of components, wherein the weight of a set of pins in the set of pressing devices applies a force to the set of components on the printed circuit board;

creating, based on the extending, a pressing plan for the first printed circuit board assembly; and performing wave soldering on the first printed circuit board assembly.

12. The method of claim 11, wherein the extending comprises lowering the pressing device in the set of pressing devices to a point that is between a point of initial contact with a component in the set of components and a point of complete contact with the component in the set of components.

13. The method of claim 11, wherein the pressing plan comprises a list of the set of pressing devices that were extended.

14. The method of claim 11, further comprising:
obtaining a second printed circuit board assembly;
determining that the pressing plan is applicable to the second printed circuit board assembly;
configuring the set of pressing devices according to the pressing plan; and
performing wave soldering on the second printed circuit board assembly.

15. The method of claim 14, further comprising;
inspecting, after the configuring, the bottom of the second printed circuit board assembly;
detecting, based on the inspecting, that at least one component in the second printed circuit-board assembly is not well seated;
reconfiguring, based on the detecting, the set of pressing devices; and
updating the pressing plan based on the reconfiguring.

16. The method of claim 15, wherein the reconfiguring comprises retracting at least one pressing device in the first set of pressing devices.

17. The method of claim 11, further comprising:
inspecting, prior to the inserting, the components of the printed circuit board assembly;
detecting, based on the inspecting, a component defect; and
pre-pressing based on the detecting, the printed circuit board assembly.

18. The method of claim 11, further comprising:
inspecting, after the configuring, the bottom of the first printed circuit board assembly;
detecting, based on the inspecting, that at least one component in the first printed circuit-board assembly is not well seated; and
reconfiguring, based on the detecting, the set of pressing devices;
wherein the pressing plan is based in part on the reconfiguring.

* * * * *